US008839053B2

(12) United States Patent
Schechter et al.

(10) Patent No.: US 8,839,053 B2
(45) Date of Patent: Sep. 16, 2014

(54) ERROR CORRECTING POINTERS FOR NON-VOLATILE STORAGE

(75) Inventors: Stuart Schechter, Kirkland, WA (US); Karin Strauss, Seattle, WA (US); Gabriel Loh, Bellevue, WA (US); Douglas C. Burger, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 478 days.

(21) Appl. No.: 12/788,329

(22) Filed: May 27, 2010

(65) Prior Publication Data
US 2011/0296258 A1 Dec. 1, 2011

(51) Int. Cl.
*G11C 29/00* (2006.01)
*G06F 11/10* (2006.01)
*H03M 13/09* (2006.01)
*G11C 13/00* (2006.01)
*H03M 13/19* (2006.01)

(52) U.S. Cl.
CPC ........ *G06F 11/1048* (2013.01); *G11C 13/0004* (2013.01); *H03M 13/19* (2013.01); *H03M 13/09* (2013.01)
USPC .......................................... 714/710; 714/723

(58) Field of Classification Search
CPC .................. G11C 29/76; G06F 2212/7211
See application file for complete search history.

(56) References Cited

U.S. PATENT DOCUMENTS

| 4,752,914 | A | * | 6/1988 | Nakano et al. ................ 365/200 |
| 4,796,261 | A |   | 1/1989 | Moriwaki |
| 5,058,059 | A | * | 10/1991 | Matsuo et al. .................. 365/96 |
| 5,161,157 | A | * | 11/1992 | Owen et al. .................... 714/710 |
| 5,233,614 | A | * | 8/1993 | Singh ............................. 714/723 |
| 5,864,569 | A |   | 1/1999 | Roohparvar |
| 6,000,006 | A | * | 12/1999 | Bruce et al. ................... 711/103 |
| 6,115,828 | A | * | 9/2000 | Tsutsumi et al. ............. 714/6.32 |
| 6,560,725 | B1 |  | 5/2003 | Longwell et al. |
| 7,322,002 | B2 |  | 1/2008 | Keays et al. |
| 7,415,644 | B2 | * | 8/2008 | Bower et al. .................. 714/724 |
| 7,509,543 | B2 | * | 3/2009 | Mohr et al. .................... 714/710 |

(Continued)

OTHER PUBLICATIONS

Tyson, S.; Wicker, G.; Lowrey, T.; Hudgens, S.; Hunt, K.; , "Non-volatile, high density, high performance phase-change memory," Aerospace Conference Proceedings, 2000 IEEE , vol. 5, No., pp. 385-390 vol. 5, 2000.*

(Continued)

*Primary Examiner* — Steve Nguyen
(74) *Attorney, Agent, or Firm* — Steve Wight; Raghu Chinagudabha; Micky Minhas

(57) ABSTRACT

Architecture that implements error correcting pointers (ECPs) with a memory row, which point to the address of failed memory cells, each of which is paired with a replacement cell to be substituted for the failed cell. If two error correcting pointers in the array point to the same cell, a precedence rule dictates the array entry with the higher index (the entry created later) takes precedence. To count the number of error correcting pointers in use, a null pointer address can be employed to indicate that a pointer is inactive, an activation bit can be added, and/or a counter, that represents the number of error correcting pointers that are active. Mechanisms are provided for wear-leveling within the error correction structure, or for pairing this scheme with single-error correcting bits for instances where transient failures may occur. The architecture also employs pointers to correct errors in volatile and non-volatile memories.

29 Claims, 12 Drawing Sheets

(56) References Cited

U.S. PATENT DOCUMENTS

| | | | | |
|---|---|---|---|---|
| 7,594,062 | B2* | 9/2009 | In et al. | 711/103 |
| 7,603,593 | B2* | 10/2009 | Iaculo et al. | 714/710 |
| 7,681,109 | B2 | 3/2010 | Litsyn et al. | |
| 7,706,198 | B2* | 4/2010 | Jeong et al. | 365/201 |
| 7,723,716 | B2* | 5/2010 | Choi | 257/4 |
| 7,917,689 | B2* | 3/2011 | Rothman et al. | 711/103 |

OTHER PUBLICATIONS

Novark, et al., "Exterminator: Automatically Correcting Memory Errors with High Probability", Retrieved at << http://groups.csail.mit.edu/pag/reading-group/novark07exterminator.pdf >>, Conference on Programming Language Design and Implementation, Proceedings of the 2007 ACM SIGPLAN conference on Programming language design and implementation, Jun. 10-13, 2007.

"Error Correction Code Pointer Control with Pointer Preprocessing", Retrieved at << http://priorartdatabase.com/IPCOM/000117903 >>, Jul. 1, 1996.

"Memory Error Detection and Correction", Retrieved at << http://www.brouhaha.com/~eric/computers/ecc.html >>, Retrieved Date: Mar. 19, 2010.

Ahn, et al., "Highly Manufacturable High Density Phase Change Memory of 64Mb and Beyond", Retrieved at << http://ieeexplore.ieee.org/stamp/stamp.jsp?tp=&arnumber=1419329&userType=inst >>, In International Electron Devices Meeting, 2004.

Bhavnagarwala, et al., "The Impact of Intrinsic Device Fluctuations on CMOS SRAM Cell Stability", Retrieved at << http://ieeexplore.ieee.org/stamp/stamp.jsp?arnumber=00913744 >>, IEEE J. Solid State Circuits, vol. 36, No. 4, Apr. 2001.

Borkar, et al., "Parameter Variation and Impact on Circuits and Microarchitecture", Retrieved at << http://eda.ee.ucla.edu/EE201A-04Spring/Intel-PV.pdf >>, Annual ACM IEEE Design Automation Conference, Proceedings of the 40th annual Design Automation Conference, Jun. 2-6, 2003.

Dhiman, et al., "PDRAM: A Hybrid PRAM and DRAM Main Memory System", Retrieved at << http://seelab.ucsd.edu/papers/gdhiman_dac09.pdf >>, Annual ACM IEEE Design Automation Conference, Proceedings of the 46th Annual Design Automation Conference, Jul. 26-31, 2009.

Freitas, et al., "Storage-class Memory: The Next Storage System Technology", Retrieved at << http://www.cs.pitt.edu/~cho/cs2410/currentsemester/papers/freitas-ibmj08.pdf >>, IBM Journal of Research and Development, vol. 52, No. 4, Jul. 2008.

"Error Detecting and Error Correcting Codes", Retrieved at << http://math.bu.edu/people/paul/242/fall99/eccodes.pdf >>.

Horii, et al., "A Novel Cell Technology using N-doped GeSbte Films for Phase Change RAM", Retrieved at << http://ieeexplore.ieee.org/stamp/stamp.jsp?tp=&arnumber=1221143&userType=inst >>, In Symposium on VLSI Technology, 2003.

Ipek, et al., "Dynamically Replicated Memory: Building Resilient Systems from Unreliable Nanoscale Memories", Retrieved at << http://research.microsoft.com/pubs/115748/asplos10.pdf >>, Architectural Support for Programming Languages and Operating Systems, Proceedings of the fifteenth edition of ASPLOS on Architectural support for programming languages and operating systems, Mar. 13-17, 2010.

Ipek, et al., "Self-optimizing Memory Controllers: A Reinforcement Learning Approach", Retrieved at http://citeseerx.ist.psu.edu/viewdoc/download?doi=10.1.1.128.3826&rep=rep1&type=pdf >>, International Symposium on Computer Architecture, Proceedings of the 35th Annual International Symposium on Computer Architecture, Jun. 21-25, 2008.

Kim, Kinam., "Technology for Sub-50nm DRAM and NAND Flash Manufacturing", Retrieved at << http://maltiel-consulting.com/Manufacturing_sub-50nm_DRAM_NAND_Flash_maltiel_expert.pdf >>, Electron Devices Meeting, IEDM Technical Digest, IEEE International, 2005.

Lee, et al., "Architecting Phase-change Memory as a Scalable DRAM Alternative", Retrieved at << ftp://ftp.cs.utexas.edu/pub/dburger/papers/ISCA09.pdf >>, International Symposium on Computer Architecture, Proceedings of the 36th annual international symposium on Computer architecture, Jun. 20-24, 2009.

Kwang-Jin, et al., "A 90nm 1.8V 512Mb Diode-switch PRAM with 266 MB/s Read Throughput", Retrieved at << http://cat.inist.fr/?aModele=afficheN&cpsidt=20222715 >>, IEEE International Solid-State Circuits Conference, vol. 43, No. 1, 2008.

May, et al., "Alpha-Particle-induced Soft Errors in Dynamic Memories", Retrieved at << http://ieeexplore.ieee.org/stamp/stamp.jsp?tp=&arnumber=1479948 >>, IEEE Transactions on Electron Devices, vol. 26, No. 1, Jan. 1979.

McNairy, et al., "Montecito: A Dual-core, Dual-thread Itanium Processor", Retrieved at << http://carbon.cudenver.edu/csprojects/CSC5593/Organization/Papers/mcnairy-montecito.pdf >>, IEEE Micro, vol. 25, No. 2, Mar. 2005.

Mukherjee, et al., "The Soft Error Problem: An Architectural Perspective", Retrieved at << http://www.eecs.umich.edu/~stever/pubs/hpca05-ser.pdf >>, HPCA, Proceedings of the 11th International Symposium on High-Performance Computer Architecture, Feb. 12-16, 2005.

"The Basics of Phase Change Memory Technology", Retrieved at << http://www.numonyx.com/Documents/WhitePapers/PCM_Basics_WP.pdf >>, White Paper.

Orshansky, et al., "Impact of Spatial Intrachip Gate Length Variability on the Performance of High-speed Digital Circuits", Retrieved at << http://citeseerx.ist.psu.edu/viewdoc/download?doi=10.1.1.59.1423&rep=rep1&type=pdf >>, IEEE Transactions on Computer-Aided Design of Intergrated Circuits and Systems, vol. 21, No. 5, May 2002.

Pellizzer, et al., "A 90nm Phase Change Memory Technology for Stand-alone Non-volatile Memory Applications", Retrieved at << http://ieeexplore.ieee.org/stamp/stamp.jsp?tp=&arnumber=1705247&userType=inst >>, In Symposium on VLSI Circuits, 2006.

Qureshi, et al., "Enhancing Lifetime and Security of Phase Change Memories via Start-gap Wear Leveling", Retrieved at << http://users.ece.utexas.edu/~qk/papers/sgap.pdf >>, In International Symposium on Microarchitecture, Nov. 2009.

Qureshi, et al., "Scalable High Performance Main Memory System Using Phase-change Memory Technology", Retrieved at << http://users.ece.utexas.edu/~qk/papers/pcm.pdf >>, ACM SIGARCH Computer Architecture News, vol. 37, No. 3, Jun. 2009.

Raoux, et al., "Phase-change Random Access Memory: A Scalable Technology", Retrieved at << http://www.signallake.com/innovation/raoux.pdf >>, IBM Journal of Research and Development, vol. 52, No. 4, Jul. 2008.

"Samsung Introduces the Next Generation of Nonvolatile Memory—Pram", Retrieved at << http://www.samsung.com/us/business/semiconductor/newsView.do?news_id=766 >>, Sep. 11, 2006.

Wilkerson, et al., "Trading off Cache Capacity for Reliability to Enable Low Voltage Operation", Retrieved at << http://pages.cs.wisc.edu/~alaa/papers/isca08_vccmin.pdf >>, ACM SIGARCH Computer Architecture News, vol. 36, No. 3, Jun. 2008.

Zhang, et al., "Characterizing and Mitigating the Impact of Process Variations on Phase Change Memory Systems", Retrieved at << http://www.ideal.ece.ufl.edu/publications/files/323-MICRO-09.pdf >>, International Symposium on Microarchitecture, Proceedings of the 42nd Annual IEEE/ACM International Symposium on Microarchitecture, Dec. 12-16, 2009.

Zhou, et al., "A Durable and Energy Efficient Main Memory Using Phase Change Memory Technology", Retrieved at << http://www.pitt.edu/~piz7/iscafp347-zhou.pdf >>, International Symposium on Computer Architecture, Proceedings of the 36th annual international symposium on Computer architecture, Jun. 20-24, 2009.

* cited by examiner

US 8,839,053 B2

ERROR CORRECTING POINTERS FOR NON-VOLATILE STORAGE

BACKGROUND

The main memories of computer systems have been implemented with charge-based DRAM (dynamic RAM) for decades, and historical trends in technology scaling have delivered exponential improvements in storage density, overall capacity, and the storage-per-dollar ratio. The traditional scaling of DRAM technology to smaller feature sizes is in jeopardy, however, as fundamental physical limitations are likely to prevent DRAM scaling in the future. Challenges include the design of capacitive cells that retain sufficient charge to store the data and the mitigation of sub-threshold leakage through the access transistors. The cells must hold enough charge that the values can be reliably read back out at a later time. The minimal amount of charge required places a limitation on how small the storage cells can ultimately scale down. Due to the non-ideal behavior of transistors, charge continues to leak through the access transistors over time, leading to the need for even more charge to be stored as well as frequent refresh operations. This places a limit on how small the access transistors can be made while keeping refresh rates within practical limits.

Phase change memory (PCM), for example, has been proposed to augment, or even replace, DRAM because of its low idle power, scalability, and persistence. Two obstacles to the adoption of PCM are its relatively low cell lifetimes, which are projected to be on the order of $10^8$ writes, and the high per-bit power cost of writing data. SEC (single error correction) and other Hamming codes and polynomial-based error correcting codes have been used for memories, but induce high wear.

One proposed mechanism to reduce power consumption and wear in PCM is to write only those cells for which the value to be written differs from the value currently stored. However, most error correcting codes introduce new cells that are likely to wear at a rate faster than the cells intended to be repaired. Wear-leveling may spread, but not eliminate, this added wear and does not address the additional power required to write codes.

Other recently-proposed error correction techniques for PCM, such as fine-grained error detection and correction using redundant pages, come at a cost of greater than 100% overheads for both space and write power.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

The disclosed architecture implements an array of error correcting pointers (ECPs) within a memory row, which point to the address of failed memory cells, each of which is paired with a replacement cell to be substituted for the failed cell. If two error correcting pointers in the array point to the same cell, the array entry with the higher index (the entry created later) takes precedence. To count the number of error correcting pointers in use, a null pointer address can be employed to indicate that a pointer is inactive, an activation bit can be switched on when the pointer is in use, and/or a counter can indicate the number of entries in use. A combination of these techniques may minimize space: a single activation bit (also referred to as a "full bit") can indicate when the entry with the highest index (the last to be activated) is in use and at all other times the entry with the highest index contains a counter of the number of other entries that are in use.

The architecture employs precedence rules that allow the error correcting scheme to correct faults within its own cells. Additionally, mechanisms are provided for wear-leveling within the error correction structure, or for pairing this scheme with Hamming codes for use in instances where transient failures may occur. The architecture also employs pointers to correct errors in non-volatile memories, such as main memories and bulk storage memory.

To the accomplishment of the foregoing and related ends, certain illustrative aspects are described herein in connection with the following description and the annexed drawings. These aspects are indicative of the various ways in which the principles disclosed herein can be practiced and all aspects and equivalents thereof are intended to be within the scope of the claimed subject matter. Other advantages and novel features will become apparent from the following detailed description when considered in conjunction with the drawings.

DETAILED DESCRIPTION

Figure 1:
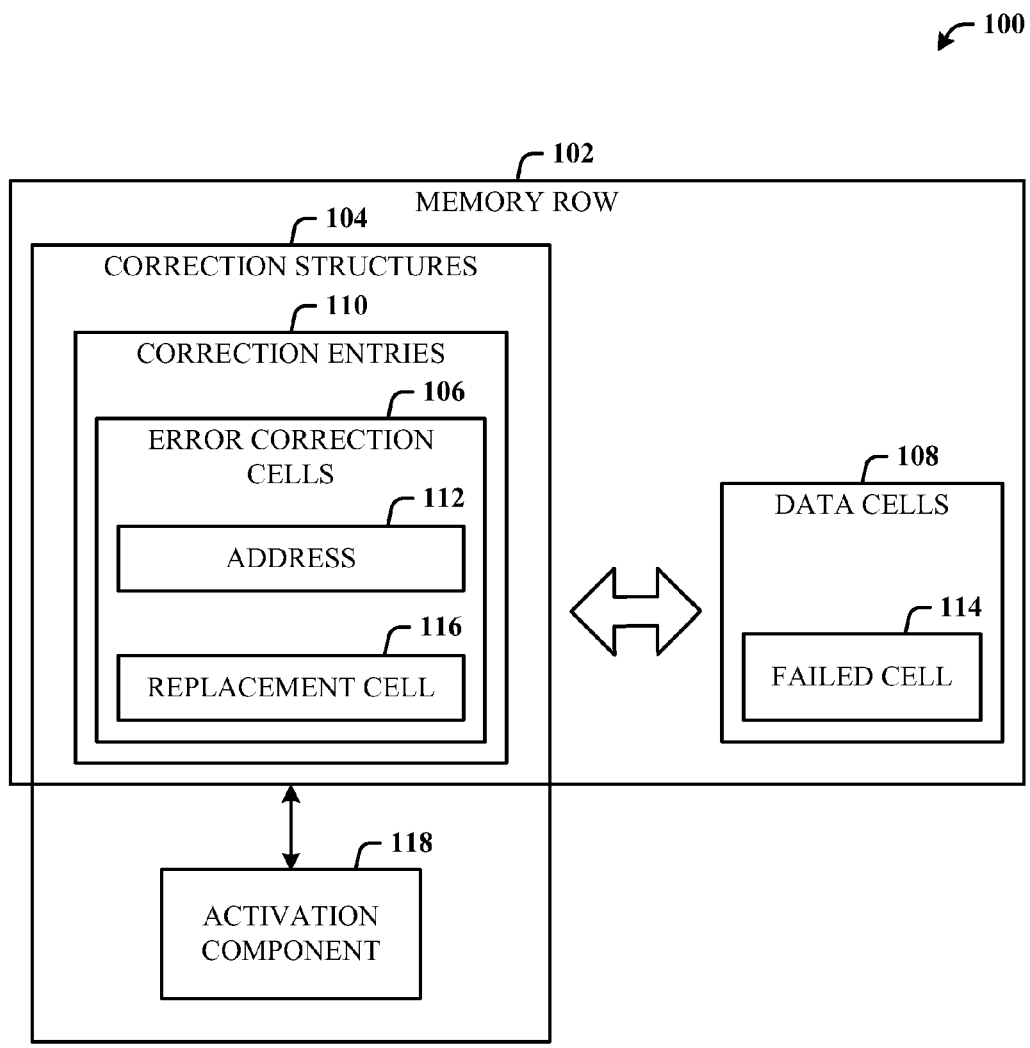
FIG. 1 illustrates a memory error correction system in accordance with the disclosed architecture.

Chip memory is used extensively in electronic data storage and processing and is quickly becoming a principal storage mechanism for mass storage devices such as in solid state drives. The repeated read/write operations on memory introduce wear in the semiconductor material such that over time, memory bits can fail, get "stuck" in either a high or low state, and generally, become unusable.

Phase change memory (PCM) is one kind of memory that exhibits bit failures over time. PCM is gaining traction as a viable DRAM-replacement technology that provides longer-term scalability. Instead of representing information as the presence or absence of electrical charge, PCM encodes bits in different physical states of special types of material. Through the application of different programming currents, the phase of the material can be melted and then resolidified into a crystalline or amorphous state, each with a distinct electrical resistance. Since the state of the material is effectively a static configuration of atoms, once programmed, the material retains its state indefinitely. This obviates the need for leakage control, refresh operations, or even supplying power to the memory array. PCM technology also gracefully scales to smaller feature sizes. As the PCM storage cells decrease in size, the total volume of phase change material per cell also decreases, thereby reducing the required amount of programming current which directly translates into faster latencies and lower power.

PCM's non-volatile nature allows for a flexible access mechanism that operates at the bit level instead of kilobyte-sized row buffers. In particular, writing data can first be preceded by a read operation that enables the comparison of the old memory contents with the new. Writing only those bits that have changed in value reduces the total number of PCM cell state changes, thereby potentially increasing the lifetime of the memory. Furthermore, the non-volatility can again be used to re-read the data contents after a write operation to verify that the write was successful. The bit-wise exclusive-or between the written data and re-read data indicates the PCM bit cells where the write failed due to either insufficient write charge or the permanent failure of a cell.

Many of the previously proposed techniques assume that all of the PCM memory cells have the same write endurance. That is, for any cell in the system, after exactly W writes, the cell fails. In real systems however, parametric variations (PV) in the manufacturing process create a non-uniform distribution of cell characteristics. From the time of initial creation, some cells are more vulnerable to failure than others. Failure to account for cell-to-cell endurance variations could actually result in some techniques reducing cell lifetimes.

The disclosed architecture considers the impact of parametric variations on memories in general, and PCMs in particular, and how to apply error-correcting techniques to cope with the inevitable cell failures. It is to be appreciated although described in the context of PCM, the disclosed architecture applies as well to other memories that fail and can wear out. An error-correction scheme, referred to as error correcting pointer (ECP), is specifically suited to the fail-on-write properties of memories (e.g., PCM). Rather than applying Hamming codes or polynomials to detect errors, the address of failed cells is permanently encoded and additional cells allocated to replace the failed cells. The encoding scheme corrects for cell failures within the correction cells without any additional error correcting schemes or cells. This approach has negligible impact on performance while significantly extending memory lifetimes in comparison to existing schemes. The technique is also orthogonal to previously proposed architectures that reduce the total number of writes sent to the PCM (e.g., via write-combining) and so the approaches can be composed for even greater longevity.

In the context of PCM, any PCM wear-leveling scheme must properly account for the different wear rates of the error-correcting bits to be effective. Furthermore, since PCMs already support a read-write-read process for write operations (the first read-write pair detects differences in the stored and written data so only bits that changed need to be written, and the last read verifies that the data were correctly written into the PCM cells), the detection of any number of write-time bit errors is effectively free. The disclosed architecture discloses error correction schemes free of the wear and power overheads required to detect post-write errors.

Coding schemes for correcting errors that result from cell failures have the potential to be significantly simpler than codes that must detect errors as well. Following is a description of an error correcting pointer ($ECP_n$, for n pointers) scheme that addresses failures in both the data cells and itself without the use of SEC (single error code) or SECDED (SEC double error detecting) codes. Additionally, the description includes other schemes that build on top of the ECP architecture.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

FIG. 1 illustrates a memory error correction system 100 in accordance with the disclosed architecture. The system 100 includes a memory row 102 (the row 102 part of a larger memory system) having associated correction structures 104. The correction structures 104 include error correction cells 106 associated with data cells 108 to store correction entries 110. A correction entry includes address information 112 of a failed data cell 114 and a replacement cell 116 that stores an in-place bit value associated with the failed data cell 114.

An activation component 118 (as part of the correction structures 104) activates a correction entry in response to detection of a failed memory data cell (e.g., failed data cell 114). The memory row 102 can be part of is non-volatile system phase-change memory, non-volatile bulk storage phase-change memory, or volatile microprocessor phase-change memory, for example. The replacement cell 116 is accessed for read and write operations directed to the failed data cell 114.

Figure 2:
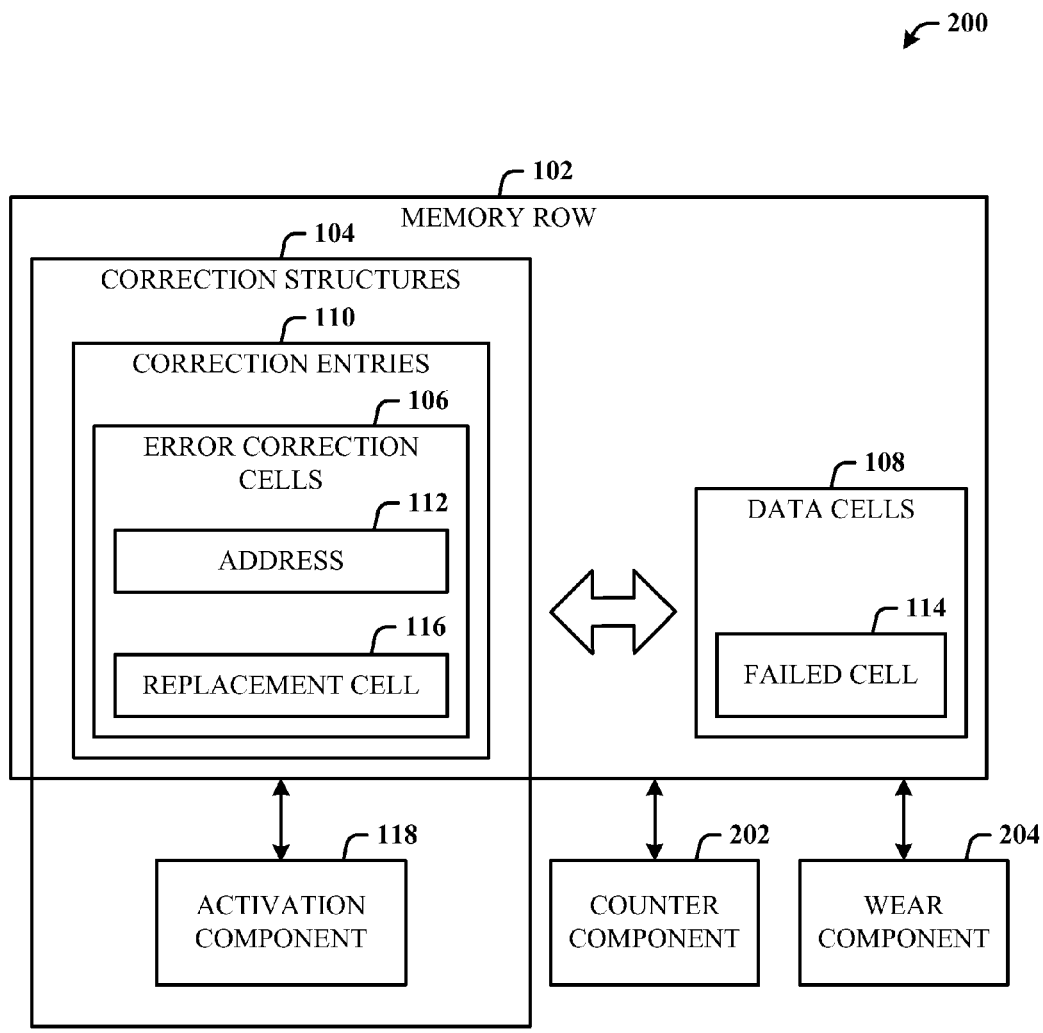
FIG. 2 illustrates an alternative embodiment of a memory error correction system.

FIG. 2 illustrates an alternative embodiment of a memory error correction system 200. The system 200 includes a counter component 202 and a wear component 204 in addition to the entities and components of the system 100 of FIG. 1. The counter component 202 counts the number of error correction pointers in use, based on null pointer address which indicates that a pointer is inactive, based on an activation bit used by the activation component, and/or based on a counter that counts active error correction pointers. The wear component 204 rotates use of cells for data and error correction to reduce wear on cells associated with the memory. The wear component 204 applies single-error correcting (SEC) to the data cells or correction entries. Note that although illustrated external to the correction structures 104, the counter component 202 and/or the wear component 204 can be included as part of the correction structures 104.

Figure 3:
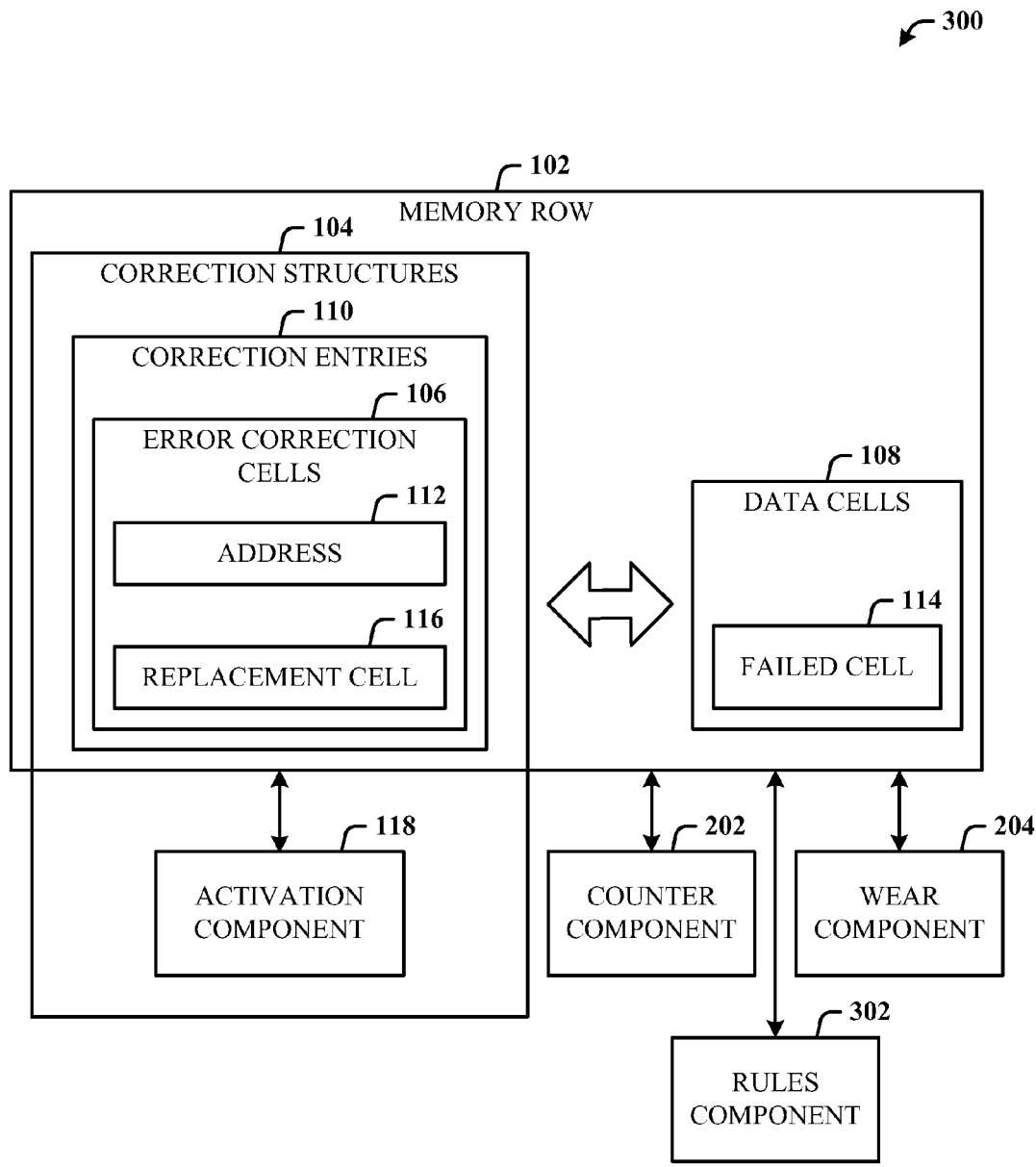
FIG. 3 illustrates an alternative embodiment of a memory error correction system that employs a rules component.

FIG. 3 illustrates an alternative embodiment of a memory error correction system 300 that employs a rules component 302. The system 300 includes correction structures 104 for the memory row 102, where the error correction cells 106 are associated with the memory data cells 108. The error correction cells 106 store the address information 112 that points to failed data cells (e.g., the failed data cell 114). The activation component 118 activates a set of the error correction cells 106 in response to detection of the failed data cell 114, and the rules component 302 applies a precedence rule which resolves precedence between multiple pointers that point to the failed data cell 114. The precedence rule(s) resolve correction of data cells or correction entries.

The system 300 further comprises the wear component 204 that randomly rotates use of data cells and metadata cells within a set of physical cells to reduce wear on the set of physical cells. The rotations induced by the wear component 204 are according to a uniform probability. The wear component 204 applies error correction to the data cells, and correction entries that comprise error correction cells. The wear component 204 employs an additional data cell in a row of bits of the memory, and which the wear component 204 can address. Note that the rules component 302 can be employed in system 100 of FIG. 1, as well as.

Figure 4:
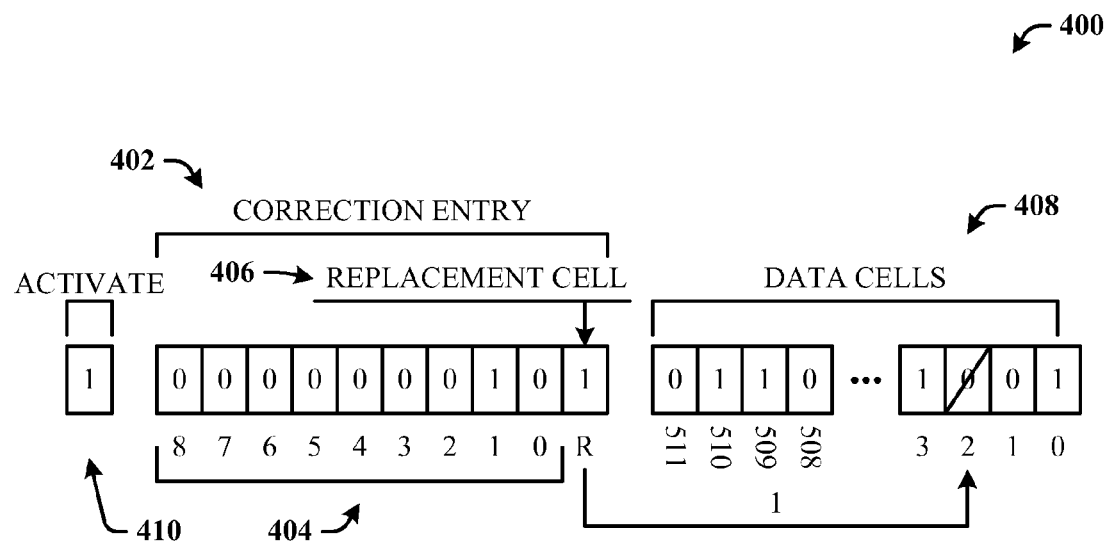
FIG. 4 illustrates a simple case for $ECP_1$ where a single correction entry can correct up to one bit in the example 512-bit block of data.

The ECP technique contains n correction entries to replace up to n failed memory cells with working cells. FIG. 4 illustrates a simple case 400 for $ECP_1$ where a single correction entry 402 can correct up to one bit in the example 512-bit block of data. The case 400 includes a set of error correction cells 404 (also referred to as the correction pointer 404), which comprise addressing bits (0-8) and a replacement cell 406 (both designated as the correction entry 402).

When no errors are present in data cells 408 (0-511 bits), an activate bit 410 is set to zero and no corrective actions are taken (the correction entry 402 is not activated). When a bit fails (e.g., bit 2) in the data cells 408, the correction entry 402 is activated, the correction pointer 404 is set to point to bit 2, and the replacement cell 406 is now used to store the value that otherwise would be stored in failed bit 2. Henceforth, when the row is written, the value to be written to the failed cell (the cell identified by the correction pointer 404) is instead written to the replacement cell 406. When the row is read, the value in the replacement cell 406 is read and is placed into the row buffer at the location specified by the correction pointer 404, supplanting the value read from the failed cell.

Figure 5:
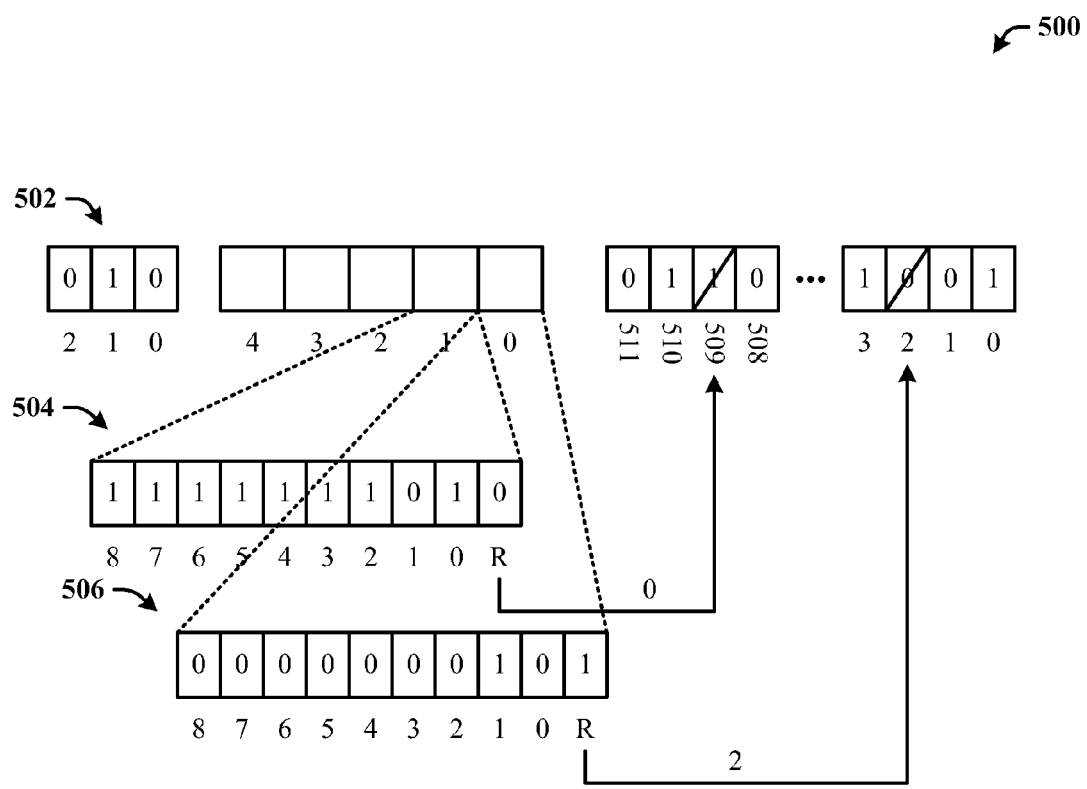
FIG. 5 illustrates a case for $ECP_5$ where the data cells have suffered two failed bits and a counter is employed.

The generalization of the $ECP_n$ scheme to correct more errors is straightforward. FIG. 5 illustrates a case 500 for $ECP_5$ where the data cells 408 have suffered two failed bits and a counter 502 is employed. The first bit to fail (bit 509) is replaced by correction entry 504 (also designated 0). The second bit to fail (bit 2) is replaced by a next correction entry 506 (also designated 2). For each allocated correction entry (e.g., 504 and 506), the corresponding correction counter 502 gets incremented to track the current number of correction entries in use. Here, the counter 502 indicates that two correction entries are used. Note that since the two correction entries (504 and 506) point to different data cells, no precedence rules are applied.

Alternatively, if the number of row data bits addressable by the correction pointer (e.g., bits 0-8 of the correction entry 504) is not a power of two, an invalid address may be used to indicate that an entry is inactive.

Figure 6:
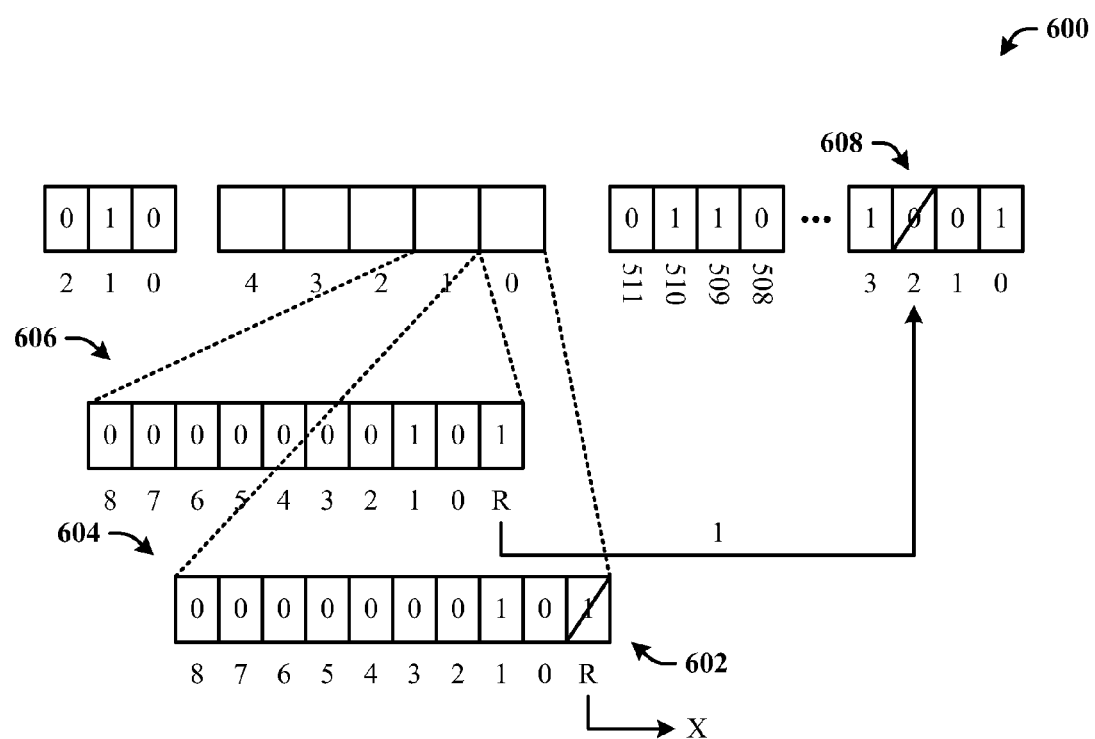
FIG. 6 illustrates a case where a replacement cell in a correction entry has failed and been corrected by a subsequent correction entry.

An attribute of the $ECP_n$ scheme is a precedence rule that enables the repair of failed cells regardless of whether the failed cells are data cells or fall within cells of correction entries. FIG. 6 illustrates a case 600 where a replacement cell 602 in a correction entry 604 has failed. To compensate for this, a next correction entry 606 (also designated 1) is activated that points to the same failed cell 608.

In accordance with a precedence rule, when more than one correction entry points to the same failed cell, the correction entry with the highest index (leftmost in the figure) takes precedence.

Figure 7:
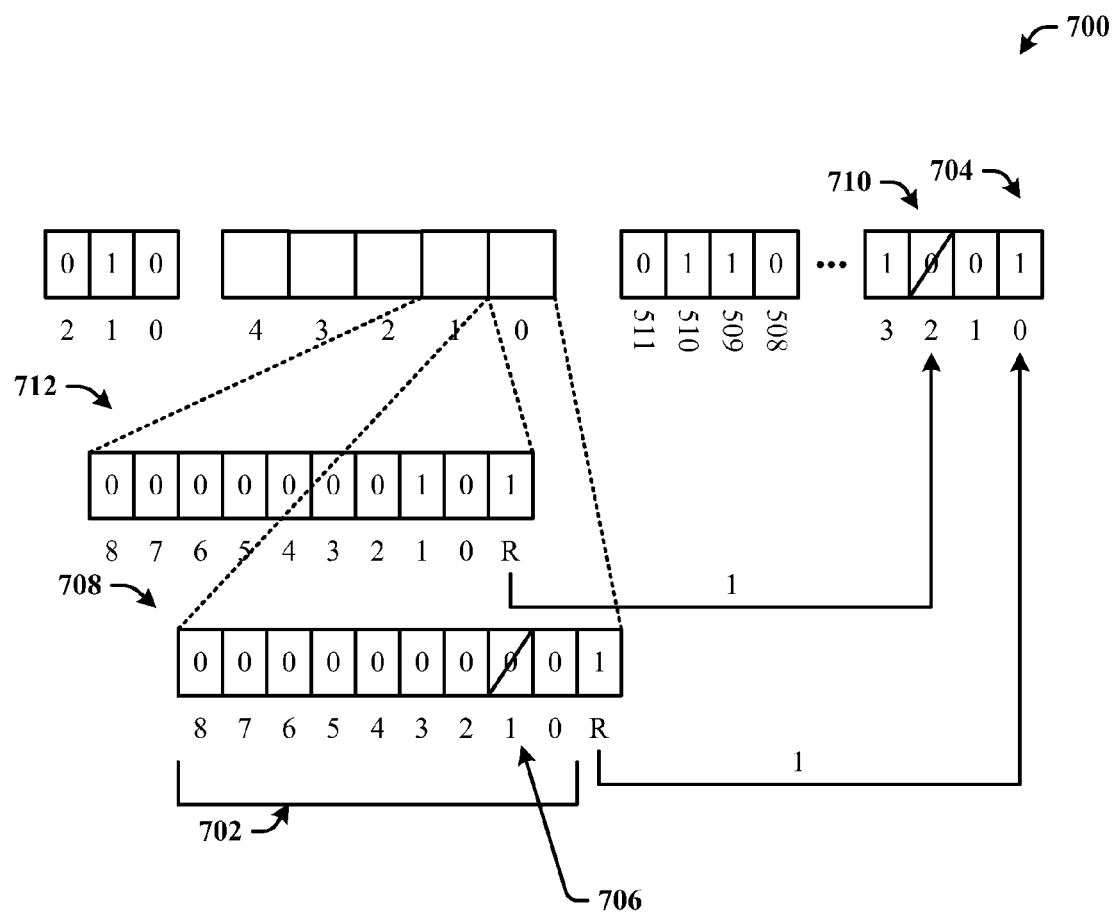
FIG. 7 illustrates a case where a correction pointer points to a functional cell.

FIG. 7 illustrates a case 700 where a correction pointer 702 points to a functional cell 704. In a similar fashion, a bit 706 of the correction pointer 702 of the correction entry 708 may fail. In this case, the correction entry 708 inadvertently points to the functional cell 704. In other words, the correction entry 708 is supposed to point to data cell 710 (also designated 2), but a fault in the correction pointer 702 causes the correction entry 708 to replace the still-functional data cell 704 (designated 0). This effectively wastes a correction entry, but replacing a working cell with another working cell with less wear does no harm.

To correct this, another correction entry 712 is allocated to correct the original failed cell 710 (bit 2) that needed replacement. In both examples of failed cells in the correction entry, whether in the replacement cell or the correction pointer, two failed cells (one data cell and one correction entry cell) result in the consumption of two correction entries.

Errors in replacement cells are less likely to occur than errors in the original data cells, as the replacement cells do not begin to wear until put into use to replace a failed cell. Errors in correction pointer and the correction counter should occur extremely rarely and primarily as a result of fabrication defects, as correction pointers are written at most once and the correction counter is written at most n times.

Overall, $ECP_n$ is capable of correcting any n cell failures within either the data cells or repair structures with only extraordinarily rare exceptions of failures that both prematurely activate correction entries and failures within the prematurely activated entries.

Thus, the elegance of the $ECP_n$ scheme lies in its ability to correct errors both in data cells and in itself, and to do so using addresses that need only be wide enough to address the row's data cells. Because the scheme works at the cell level, it is equally effective for use in multi-level cell (MLC) memories that store more than one bit per cell.

Following is a description of other schemes that can be built upon the $ECP_n$ scheme.

With respect to applying wear-leveling to ECP ($WL\_ECP_n$), the correction entries and correction counter in $ECP_n$ receive less wear than data bits. It is assumed that writes are already wear-leveled, external wear-leveling mechanisms that can only level wear within externally visible data cells and cannot spread wear among the internal meta-data cells used for error correcting structures. The only way to spread wear between data bits and metadata bits is to internalize the wear-leveling mechanism to encompass both.

Figure 8:
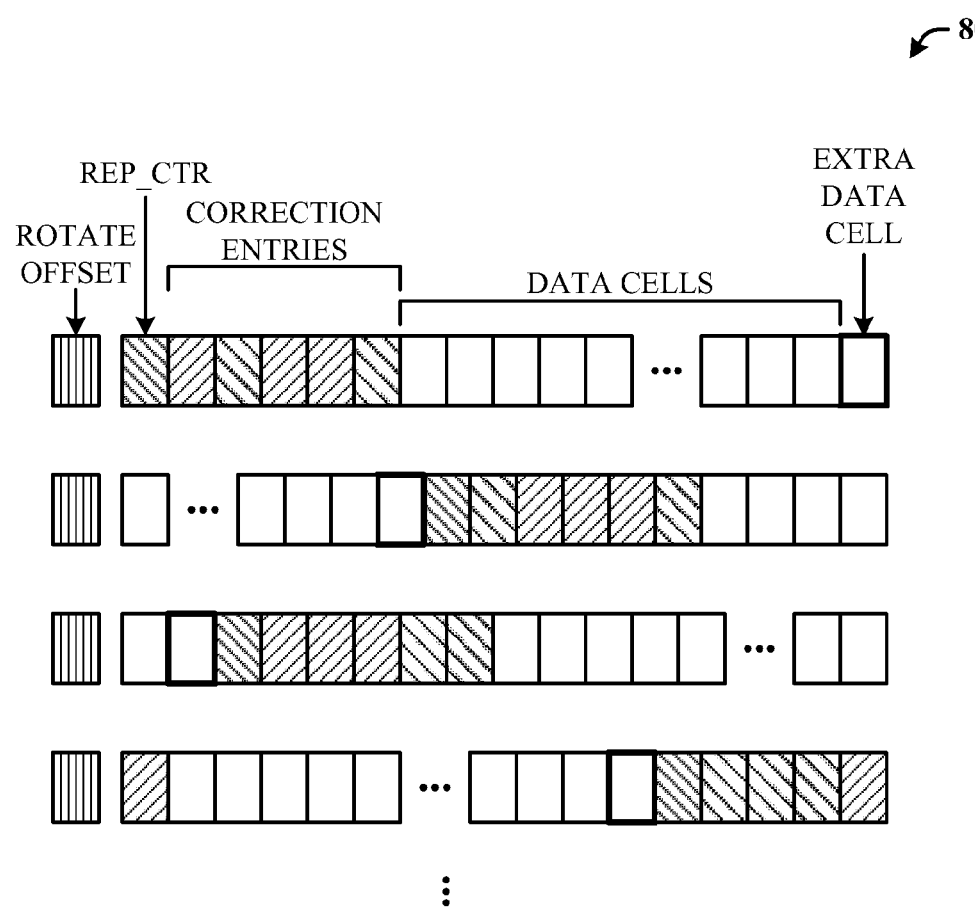
FIG. 8 illustrates a rotating wear leveler.

To this end, a rotating wear leveler (RWL) is provided that rotates both the error correcting bits and data bits around random positions over a single set of physical cells. FIG. 8 illustrates a rotating wear leveler 800. The rotating wear leveler 800 periodically rotates the entire PCM row including data and correction bits by a random offset. Rotations are induced at random with a uniform probability, rather than using a counter. For a mean cell lifetime of $10^8$ bits, a rotation probability of $10^{-4}$ can be employed. Since the probability that a given bit will change during a rotation is ½, the expected wear induced by the wear-leveling on each bit is $½ \cdot 10^{-4}$ ($5 \cdot 10^{-5}$) bit-writes per write to the row. While infrequent enough to cause negligible wear, the rotator is expected to visit each possible rotation approximately twenty times over a period of $10^8$ writes to the row even in the worst case of a 512-bit row buffer with as many possible rotation positions.

For a row buffer containing m bits of data and repair structures, the rotating wear leveler requires $[\log_2 m]$ bits: enough to represent all possible positions in the rotation. The very low frequency of wear leveling ensures that cell failures within the wear leveler are extremely rare. If it can be assumed that transient failures are sufficiently improbable then no correction mechanism may be required. If transient failures are possible, an SEC code can be added to the wear leveler to ensure that the correct rotation can be recovered in the event of such an error.

In addition to using the RWL to reduce wear, an additional physical data cell can be added to the space that the wear leveler can address. Thus, at any given time one cell is rotated out of use. This extra data cell enables the scheme to repair one additional failed cell.

Figure 9:
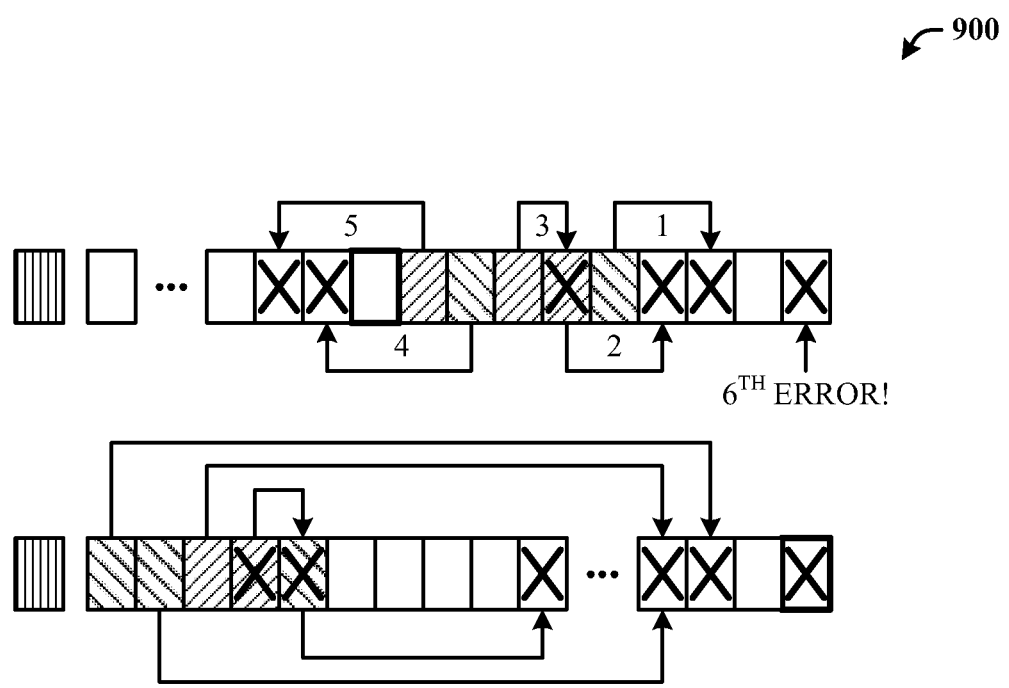
FIG. 9 illustrates a line using $WL\_ECP_5$ where all five correction entries have already been used up and a sixth error has been detected.

An extra data cell may also trigger a widening of the correction pointers, incurring additional space overhead. FIG. 9 illustrates a line 900 using $WL\_ECP_5$ where all five correction entries have already been used up and a sixth error has been detected. The inclusion of one extra data cell provides a slight increase in expected lifetime and enables the tolerance of one additional bit failure. For $ECP_n$, the first n failures are handled by the correction entries, and the n+1 st is covered by rotating the row such that the extra data bit aligns with the failed cell, although this comes at the cost that the wear leveler can no longer be used. By rotating this final error out of use, this scheme tolerates up to n+1 failures per row. The wear-level scheme with an extra bit is a stop-gap technique applied at the level of bits within a row.

However, wear-leveling the $ECP_n$ scheme can add additional complexity. Address entries store the failed bit locations by physical (non-rotated) location, requiring an additional bit per entry, as the bit to be replaced could otherwise be rotated out of the address space. More importantly, the correction counter must not be rotated onto an error bit that would change its value. If correction entry a points to a dead bit in correction entry b, the address in correction entry a is replaced with the address in correction entry b.

With respect to single error code—error correcting pointer ($SEC\_ECP_n$), the one known possible cause of post-write-time errors is the slow melting of the phase change material at extremely high temperatures. If the probabilities of such failures become sufficiently high to warrant the use of mechanisms for correcting transient failures, a single error correcting Hamming code can still be applied external to the memory row, at the granularity in which data is read and written to memory (e.g., 64-bit blocks), as currently implemented in today's DRAM memory architectures. Note that SEC can be applied at multiple granularities, some of which make more sense than others depending on the application, for example.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 10:
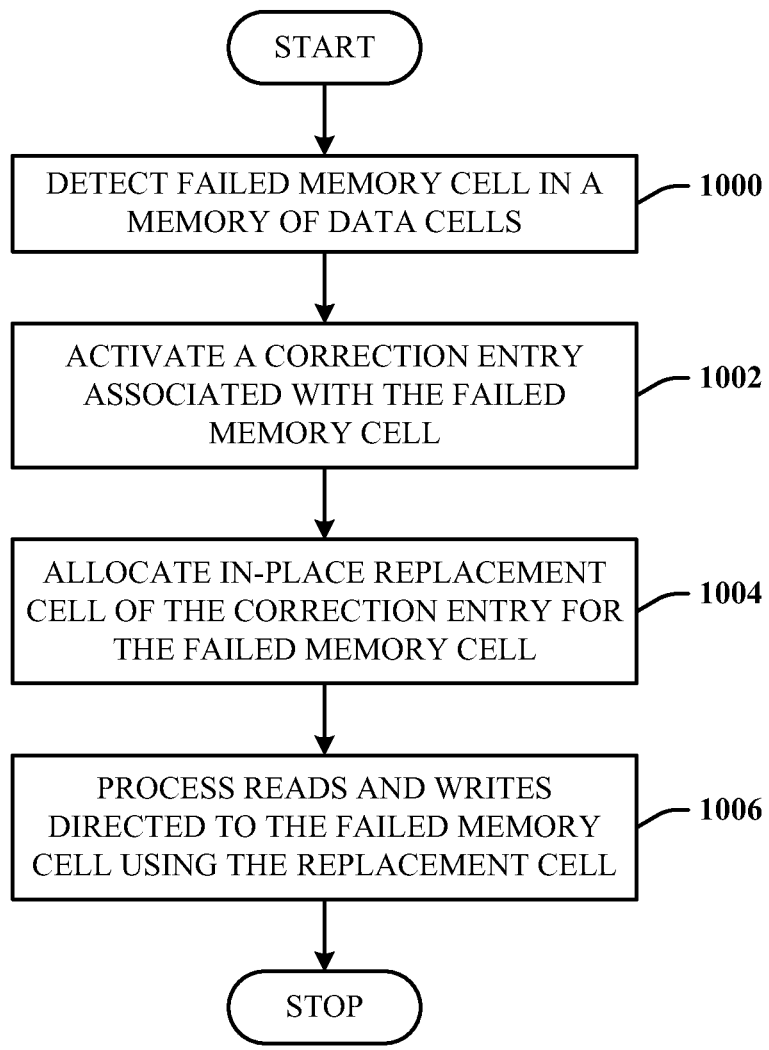
FIG. 10 illustrates a memory error correction method in accordance with the disclosed architecture.

FIG. 10 illustrates a memory error correction method in accordance with the disclosed architecture. At 1000, a failed memory cell is detected in a memory of data cells. At 1002, a correction entry associated with the failed memory cell is activated. At 1004, an in-place replacement cell of the correction entry is allocated for the failed memory cell. At 1006, reads and writes directed to the failed memory cell are processed using the replacement cell.

Figure 11:
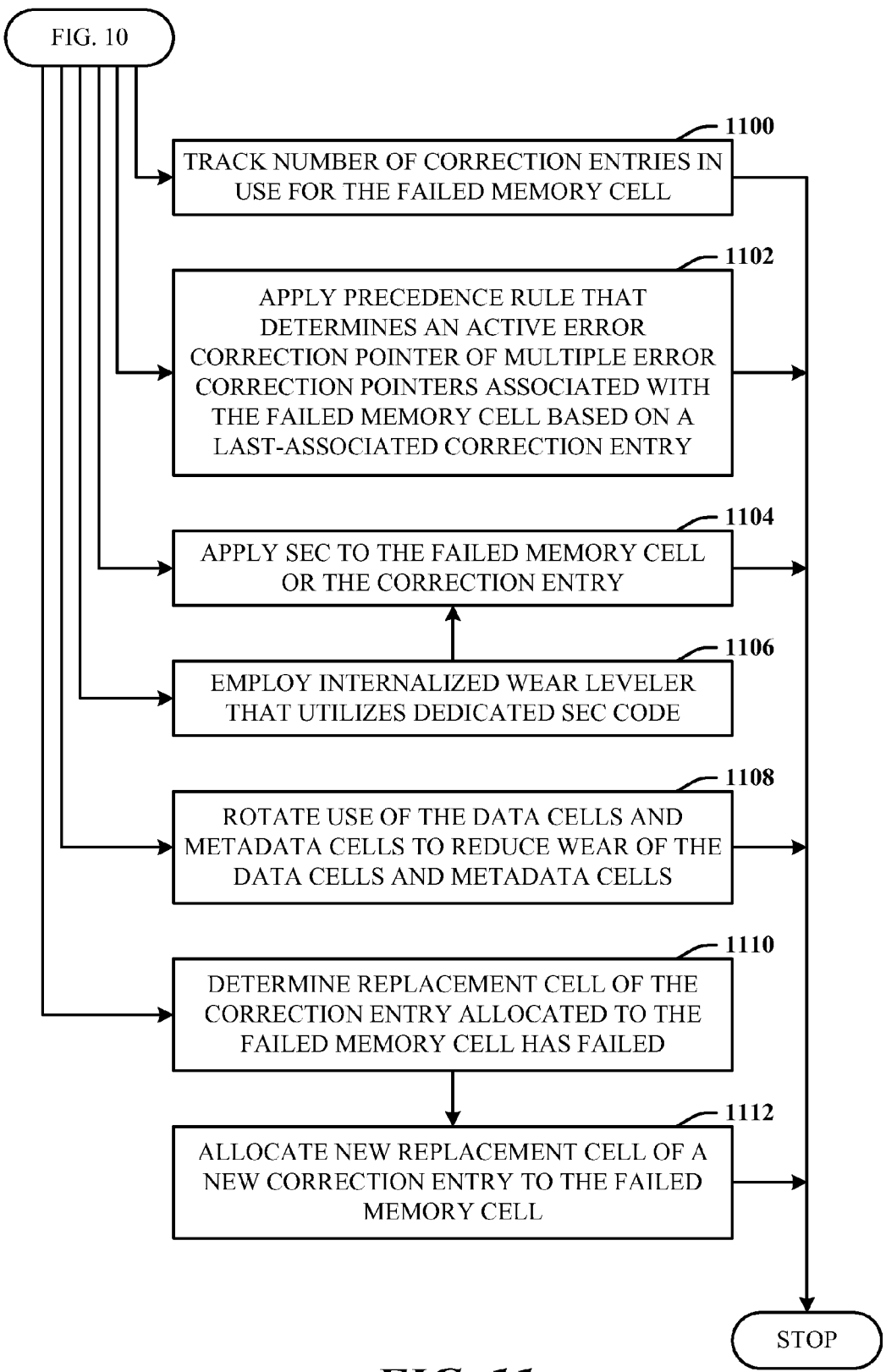
FIG. 11 illustrates further aspects of the method of FIG. 10.

FIG. 11 illustrates further aspects of the method of FIG. 10. At 1100, a number of correction entries in use for the failed memory cell is tracked. At 1102, a precedence rule is applied that determines an active error correction pointer of multiple error correction pointers associated with the failed memory cell based on a last-associated correction entry. At 1104, SEC is applied to the failed memory cell or the correction entry. At 1106, an internalized wear leveler is employed that utilizes dedicated SEC code. At 1108, use of the data cells and metadata cells is rotated to reduce wear of the data cells and metadata cells. At 1110, the replacement cell of the correction entry allocated to the failed memory cell has failed is determined. At 1112, a new replacement cell of a new correction entry is allocated to the failed memory cell.

As used in this application, the terms "component" and "system" are intended to refer to a computer-related entity, either hardware, a combination of software and tangible hardware, software, or software in execution. For example, a component can be, but is not limited to, tangible components such as a processor, chip memory, mass storage devices (e.g., optical drives, solid state drives, and/or magnetic storage media drives), and computers, and software components such as a process running on a processor, an object, an executable, module, a thread of execution, and/or a program. By way of illustration, both an application running on a server and the server can be a component. One or more components can reside within a process and/or thread of execution, and a component can be localized on one computer and/or distributed between two or more computers. The word "exemplary" may be used herein to mean serving as an example, instance, or illustration. Any aspect or design described herein as "exemplary" is not necessarily to be construed as preferred or advantageous over other aspects or designs.

Figure 12:
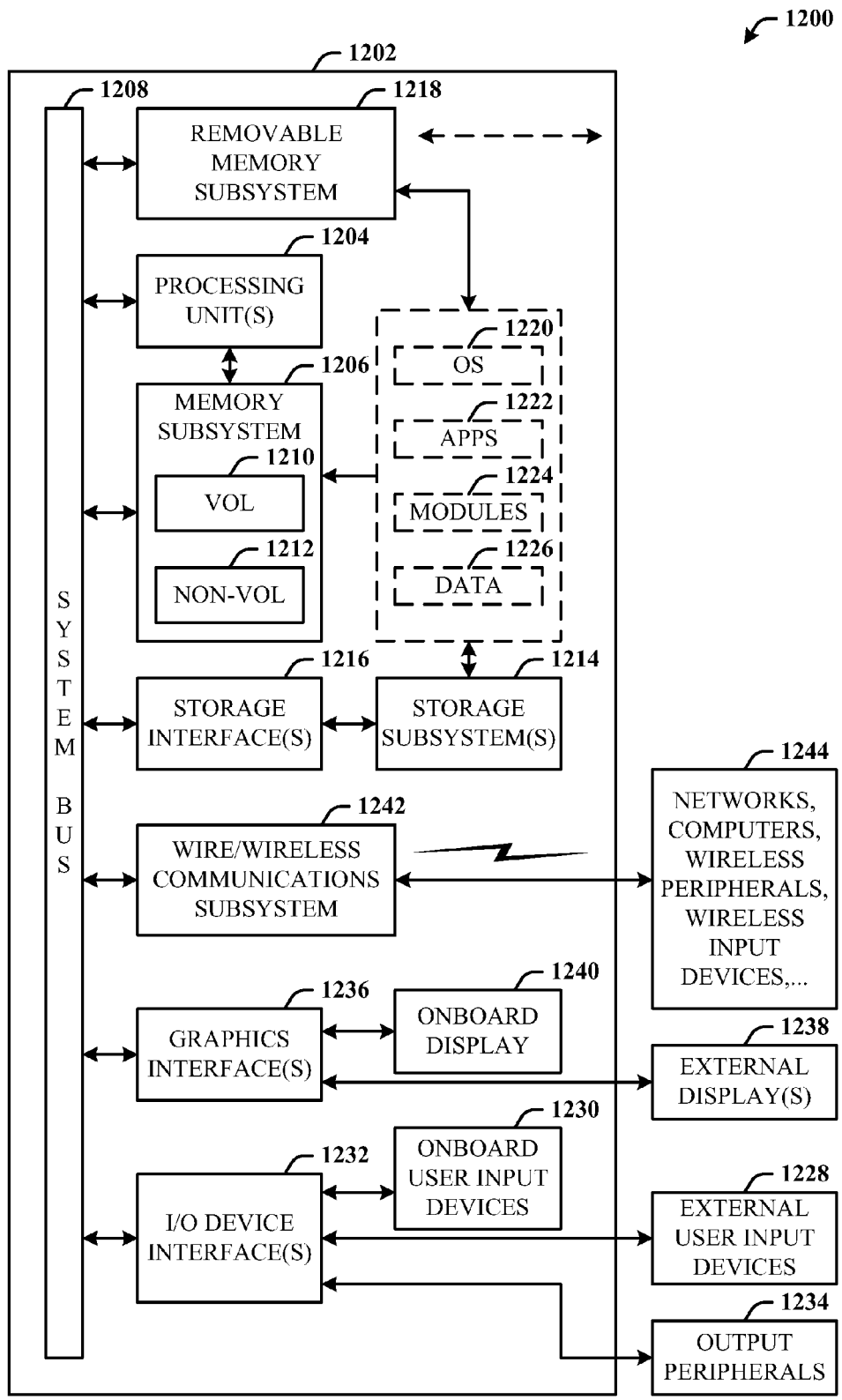
FIG. 12 illustrates a block diagram of a computing system that employs error correction pointers in accordance with the disclosed architecture.

Referring now to FIG. 12, there is illustrated a block diagram of a computing system 1200 that employs error correction pointers in accordance with the disclosed architecture. In order to provide additional context for various aspects thereof, FIG. 12 and the following description are intended to provide a brief, general description of the suitable computing system 1200 in which the various aspects can be implemented. While the description above is in the general context of computer-executable instructions that can run on one or more computers, those skilled in the art will recognize that a novel embodiment also can be implemented in combination with other program modules and/or as a combination of hardware and software.

The computing system 1200 for implementing various aspects includes the computer 1202 having processing unit(s) 1204, a computer-readable storage such as a system memory 1206, and a system bus 1208. The processing unit(s) 1204 can be any of various commercially available processors such as single-processor, multi-processor, single-core units and multi-core units. Moreover, those skilled in the art will appreciate that the novel methods can be practiced with other computer system configurations, including minicomputers, mainframe computers, as well as personal computers (e.g., desktop, laptop, etc.), hand-held computing devices, microprocessor-based or programmable consumer electronics, and the like, each of which can be operatively coupled to one or more associated devices.

The system memory 1206 can include computer-readable storage (physical storage media) such as a volatile (VOL) memory 1210 (e.g., random access memory (RAM)) and non-volatile memory (NON-VOL) 1212 (e.g., ROM, EPROM, EEPROM, etc.). A basic input/output system (BIOS) can be stored in the non-volatile memory 1212, and includes the basic routines that facilitate the communication of data and signals between components within the computer 1202, such as during startup. The volatile memory 1210 can also include a high-speed RAM such as static RAM for caching data. The memory (1210 and 1212) can obtain the benefits of error correction pointers as described herein.

The system bus 1208 provides an interface for system components including, but not limited to, the system memory 1206 to the processing unit(s) 1204. The system bus 1208 can be any of several types of bus structure that can further interconnect to a memory bus (with or without a memory controller), and a peripheral bus (e.g., PCI, PCIe, AGP, LPC, etc.), using any of a variety of commercially available bus architectures.

The computer 1202 further includes machine readable storage subsystem(s) 1214 and storage interface(s) 1216 for interfacing the storage subsystem(s) 1214 to the system bus 1208 and other desired computer components. The storage subsystem(s) 1214 (physical storage media) can include one or more of a hard disk drive (HDD), a magnetic floppy disk drive (FDD), and/or optical disk storage drive (e.g., a CD-ROM drive DVD drive), for example. The storage interface(s) 1216 can include interface technologies such as EIDE, ATA, SATA, and IEEE 1394, for example.

One or more programs and data can be stored in the memory subsystem 1206, a machine readable and removable memory subsystem 1218 (e.g., flash drive form factor technology), and/or the storage subsystem(s) 1214 (e.g., optical, magnetic, solid state), including an operating system 1220, one or more application programs 1222, other program modules 1224, and program data 1226.

Generally, programs include routines, methods, data structures, other software components, etc., that perform particular tasks or implement particular abstract data types. All or portions of the operating system 1220, applications 1222, modules 1224, and/or data 1226 can also be cached in memory such as the volatile memory 1210, for example. It is to be appreciated that the disclosed architecture can be implemented with various commercially available operating systems or combinations of operating systems (e.g., as virtual machines).

The storage subsystem(s) 1214 and memory subsystems (1206 and 1218) serve as computer readable media for volatile and non-volatile storage of data, data structures, computer-executable instructions, and so forth. Such instructions, when executed by a computer or other machine, can cause the computer or other machine to perform one or more acts of a method. The instructions to perform the acts can be stored on one medium, or could be stored across multiple media, so that the instructions appear collectively on the one or more computer-readable storage media, regardless of whether all of the instructions are on the same media.

Computer readable media can be any available media that can be accessed by the computer 1202 and includes volatile and non-volatile internal and/or external media that is removable or non-removable. For the computer 1202, the media accommodate the storage of data in any suitable digital format. It should be appreciated by those skilled in the art that other types of computer readable media can be employed such as zip drives, magnetic tape, flash memory cards, flash drives, cartridges, and the like, for storing computer executable instructions for performing the novel methods of the disclosed architecture.

A user can interact with the computer 1202, programs, and data using external user input devices 1228 such as a keyboard and a mouse. Other external user input devices 1228 can include a microphone, an IR (infrared) remote control, a joystick, a game pad, camera recognition systems, a stylus pen, touch screen, gesture systems (e.g., eye movement, head movement, etc.), and/or the like. The user can interact with the computer 1202, programs, and data using onboard user input devices 1230 such a touchpad, microphone, keyboard, etc., where the computer 1202 is a portable computer, for example. These and other input devices are connected to the processing unit(s) 1204 through input/output (I/O) device interface(s) 1232 via the system bus 1208, but can be connected by other interfaces such as a parallel port, IEEE 1394 serial port, a game port, a USB port, an IR interface, etc. The I/O device interface(s) 1232 also facilitate the use of output peripherals 1234 such as printers, audio devices, camera devices, and so on, such as a sound card and/or onboard audio processing capability.

One or more graphics interface(s) 1236 (also commonly referred to as a graphics processing unit (GPU)) provide graphics and video signals between the computer 1202 and external display(s) 1238 (e.g., LCD, plasma) and/or onboard displays 1240 (e.g., for portable computer). The graphics interface(s) 1236 can also be manufactured as part of the computer system board.

The computer 1202 can operate in a networked environment (e.g., IP-based) using logical connections via a wired/wireless communications subsystem 1242 to one or more networks and/or other computers. The other computers can include workstations, servers, routers, personal computers, microprocessor-based entertainment appliances, peer devices or other common network nodes, and typically include many or all of the elements described relative to the computer 1202. The logical connections can include wired/wireless connectivity to a local area network (LAN), a wide area network (WAN), hotspot, and so on. LAN and WAN networking environments are commonplace in offices and companies and facilitate enterprise-wide computer networks, such as intranets, all of which may connect to a global communications network such as the Internet.

When used in a networking environment the computer 1202 connects to the network via a wired/wireless communication subsystem 1242 (e.g., a network interface adapter, onboard transceiver subsystem, etc.) to communicate with wired/wireless networks, wired/wireless printers, wired/wireless input devices 1244, and so on. The computer 1202 can include a modem or other means for establishing communications over the network. In a networked environment, programs and data relative to the computer 1202 can be stored in the remote memory/storage device, as is associated with a distributed system. It will be appreciated that the network connections shown are exemplary and other means of establishing a communications link between the computers can be used.

The computer 1202 is operable to communicate with wired/wireless devices or entities using the radio technologies such as the IEEE 802.xx family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity) for hotspots, WiMax, and Bluetooth™ wireless technologies. Thus, the communications can be a predefined structure as with a conventional network or simply an ad hoc communication between at least two devices. Wi-Fi networks use radio technologies called IEEE 802.11x (a, b, g, etc.) to provide secure, reliable, fast wireless connectivity. A Wi-Fi network can be used to connect computers to each other, to the Internet, and to wire networks (which use IEEE 802.3-related media and functions).

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A memory error correction system, comprising:
   error correction cells of a phase change memory, the error correction cells associated with memory cells to store error correction entries, an error correction entry includes address information of a failed memory cell and a replacement cell that stores an in-place bit value associated with the failed memory cell; and
   a counter component that counts a number of error correction entries used to store error correction pointers, wherein if fewer than all the error correction entries are storing error correction pointers memory cells of a last correction entry to be used store a counter that indicates a number of error correction entries used to store error correction pointers.

2. The system of claim 1, wherein the phase change memory is non-volatile system phase-change memory, non-volatile bulk storage phase-change memory, or volatile microprocessor phase-change memory.

3. The system of claim 1, wherein the replacement cell is accessed for read and write operations directed to the failed memory cell.

4. The system of claim 1, wherein the counter component counts the number of error correction pointers in use based on a null pointer address which indicates that a pointer is inactive.

5. The system of claim 1, wherein the counter component counts the number of error correction entries in use based on an activation bit used by an activation component.

6. The system of claim 1, wherein the counter component counts the number of error correction entries in use based on a counter that counts active error correction entries.

7. The system of claim 1, further comprising a wear component that rotates use of cells for data and error correction to reduce wear on cells associated with the memory.

8. The system of claim 7, wherein the wear component applies single-error correction (SEC) to cells that store a number of bits of rotation.

9. The system of claim 1, wherein a Hamming code is employed internal or external to an on-chip memory row.

10. The system of claim 1, wherein a single bit is set if all error correction entries are storing error correction pointers are in use, and if not set, memory cells of a last correction entry to be used store a counter that indicates a number of error correction entries used to store error correction pointers.

11. A memory error correction system, comprising:
    error correction cells of a phase change memory, the error correction cells associated with memory cells that store address information which points to failed memory cells; and
    a counter component that counts a number of error correction entries used to store correction pointers, wherein if fewer than all the error correction entries are storing error correction pointers memory cells of a last correction entry to be used store a counter that indicates a number of error correction entries used to store error correction pointers.

12. The system of claim 11, further comprising a wear component that rotates use of data cells and metadata cells within a set of physical cells to reduce wear on the set of physical cells.

13. The system of claim 12, wherein the rotations induced by the wear component are according to a uniform probability.

14. The system of claim 12, wherein the wear component employs an extra data cell in a set of data cells in a row of bits of the memory, and which the wear component can address.

15. The system of claim 11, wherein a Hamming code is employed internal or external to an on-chip memory row.

16. The system of claim 11, further comprising a rules component that applies a precedence rule which resolves precedence between multiple error correction pointers that point to the failed memory cell.

17. The system of claim 16, wherein the precedence rule resolves correction of data cells or correction entries.

18. A memory error correction system, comprising:
    error correction cells of a phase change memory, the error correction cells associated with memory cells to store error correction entries, an error correction entry includes address information of a failed memory cell and a replacement cell that stores an in- place bit value associated with the failed memory cell;
    an activation component that activates a correction entry in response to detection of a failed memory cell, the replacement cell accessed for read and write operations; and
    a counter component that counts a number of error correction entries used to store error correction pointers, wherein if fewer than all the error correction entries are storing error correction pointers memory cells of a last correction entry to be used store a counter that indicates a number of error correction entries used to store error correction pointers.

19. The system of claim 18, wherein the counter component that counts the number of error correction entries in use is based on, alternatively, a null pointer address which indicates that a pointer is inactive, based on an activation bit used by the activation component, or based on a counter that counts active error correction entries.

20. The system of claim 18, wherein a Hamming code is employed internal or external to an on-chip memory row.

21. The system of claim 18, wherein each memory cell has an associated replacement cell, and error correction entries that comprise the error correction cells are related to size of the memory.

22. The system of claim 18, further comprising a rules component that applies a precedence rule which resolves precedence between multiple pointers that point to the failed memory cell, and a wear component that randomly rotates use of data cells and metadata cells within a set of physical cells to reduce wear on the set of physical cells.

23. A memory error correction method executed by a processor, comprising:
    activating an error correction entry associated with a failed memory cell in a phase change memory of data cells;
    allocating an in-place replacement cell of the error correction entry for the failed memory cell;
    counting a number of error correction entries used to store error correction pointers, wherein when fewer than all the error correction entries associated with the data cells are used, then storing a counter in memory cells of a last error correction entry to be used, the counter indicating a number of error correcgtion entries used to store error correction pointers; and processing reads and writes directed to the failed memory cell using the replacement cell.

24. The method of claim 23, wherein the number comprises a plurality of error correction entries.

25. The method of claim 23, further comprising applying a precedence rule that determines an active error correction pointer of multiple error correction pointers associated with the failed memory cell based on a last-associated error correction entry.

26. The method of claim 23, further comprising applying SEC (single-error correction) to the failed memory cell or the error correction entry.

27. The method of claim 26, further comprising employing an internalized wear leveler that utilizes dedicated SEC (single-error correction) code.

28. The method of claim 23, further comprising rotating use of the data cells and metadata cells to reduce wear of the data cells and metadata cells.

29. The method of claim 23, further comprising:
determining the replacement cell of the error correction entry allocated to the failed memory cell has failed; and
allocating a new replacement cell of a new error correction entry to the failed memory cell.

* * * * *